(12) United States Patent
Yamazaki et al.

(10) Patent No.: US 8,331,996 B2
(45) Date of Patent: Dec. 11, 2012

(54) ELECTRONIC DEVICES

(75) Inventors: Shunpei Yamazaki, Tokyo (JP); Yasuko Watanabe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1830 days.

(21) Appl. No.: 10/072,496

(22) Filed: Feb. 5, 2002

(65) Prior Publication Data

US 2002/0107055 A1   Aug. 8, 2002

(30) Foreign Application Priority Data

Feb. 7, 2001 (JP) ................................. 2001-030840

(51) Int. Cl.
*H04M 1/00* (2006.01)
(52) U.S. Cl. .................. 455/575.1; 455/575.3; 455/566; 455/90.2; 455/90.3
(58) Field of Classification Search .............. 455/575.1, 455/575.3, 90.1, 90.2, 90.3, 550.1; D14/137, D14/138, 140
See application file for complete search history.

(56) References Cited

U.S. PATENT DOCUMENTS

| | | | | |
|---|---|---|---|---|
| 5,251,329 A * | 10/1993 | Takagi et al. | ................. | 455/572 |
| 5,630,211 A * | 5/1997 | Nagai | ......................... | 455/575.7 |
| D406,587 S * | 3/1999 | Wicks et al. | ................. | D14/138 |
| 6,081,207 A * | 6/2000 | Batio | .............................. | 341/20 |
| D432,105 S | 10/2000 | Hyun | | |
| D450,046 S | 11/2001 | Chun | | |
| 6,466,202 B1 * | 10/2002 | Suso et al. | ..................... | 345/169 |
| 6,697,083 B1 * | 2/2004 | Yoon | ............................. | 345/658 |
| 2002/0034930 A1 | 3/2002 | Yamazaki et al. | | |
| 2002/0077160 A1 * | 6/2002 | Edwards et al. | ............. | 455/575 |

FOREIGN PATENT DOCUMENTS

| | | |
|---|---|---|
| JP | 05-083342 | 4/1993 |
| JP | 07-212440 A | 8/1995 |
| JP | 08-321863 A | 12/1996 |
| JP | 09-065436 A | 3/1997 |
| JP | 09-247752 A | 9/1997 |

* cited by examiner

*Primary Examiner* — Erika A Washington
(74) *Attorney, Agent, or Firm* — Fish & Richardson P.C.

(57) ABSTRACT

An electronic device capable of transmitting and receiving a mail through an internet usually has from 12 to 20 operation keys inclusive of numerical keys and special keys. In order to input Japanese characters inclusive of "kanji" and special characters as data, complex operations must be executed by changing over the input mode. A portable data terminal as represented by a cellular phone or an electronic device such as a data terminal as represented by a personal computer or a desk top telephone, has such a shape that the first center line of the first housing and the second center line of the second housing come into agreement and in parallel with each other only in a state where the first housing and the second housing are folded by the hinge.

21 Claims, 17 Drawing Sheets

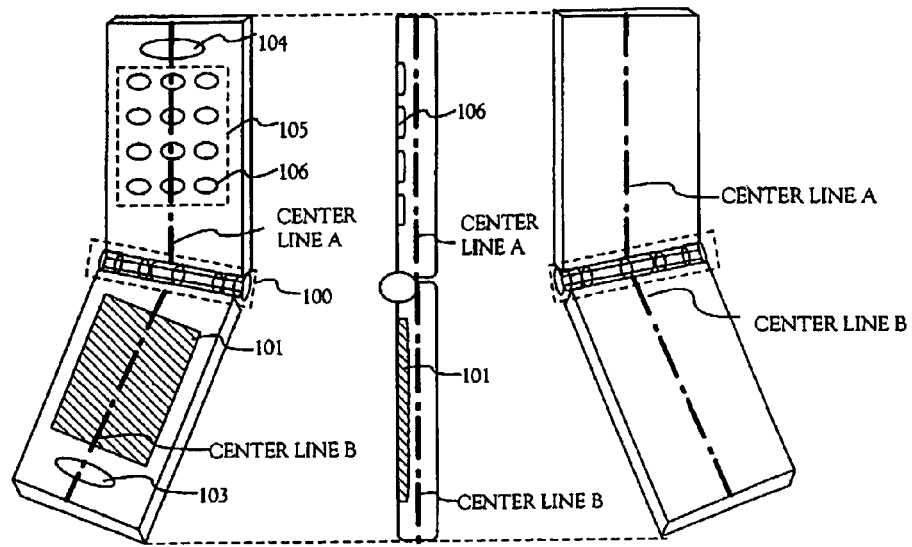
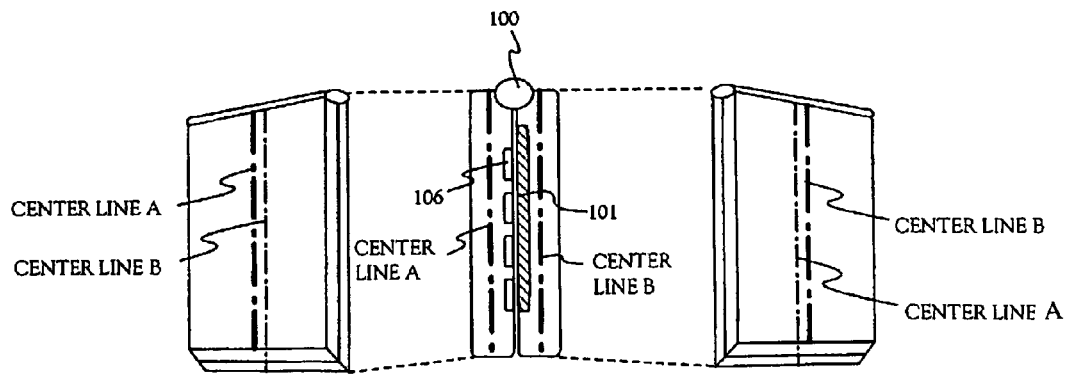
FIG. 1A  FIG. 1B  FIG. 1C
FIG. 1D  FIG. 1E  FIG. 1F

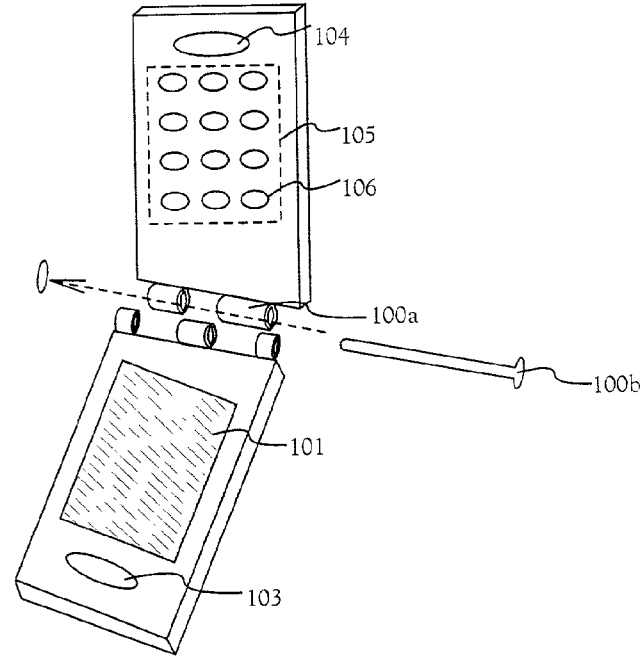
FIG. 2A  FIG. 2B
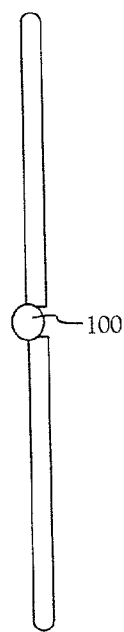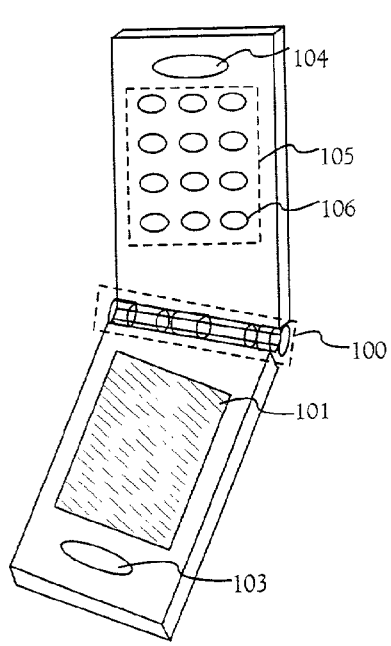
FIG. 2C  FIG. 2D

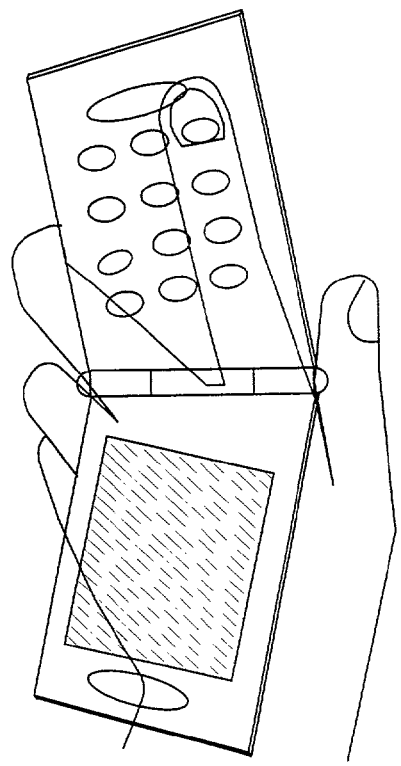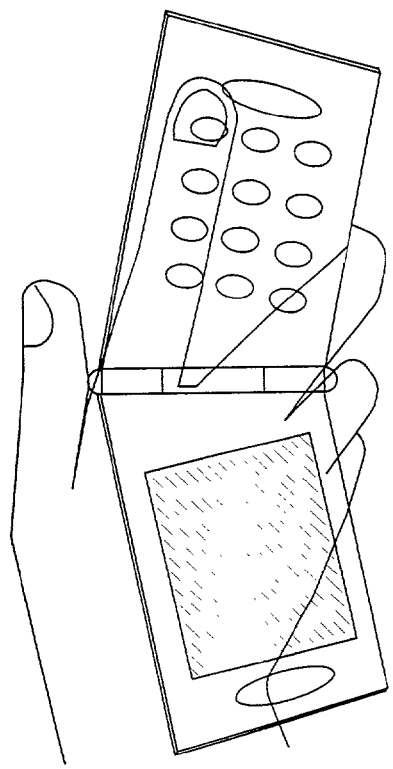
FIG. 4A                    FIG. 4B

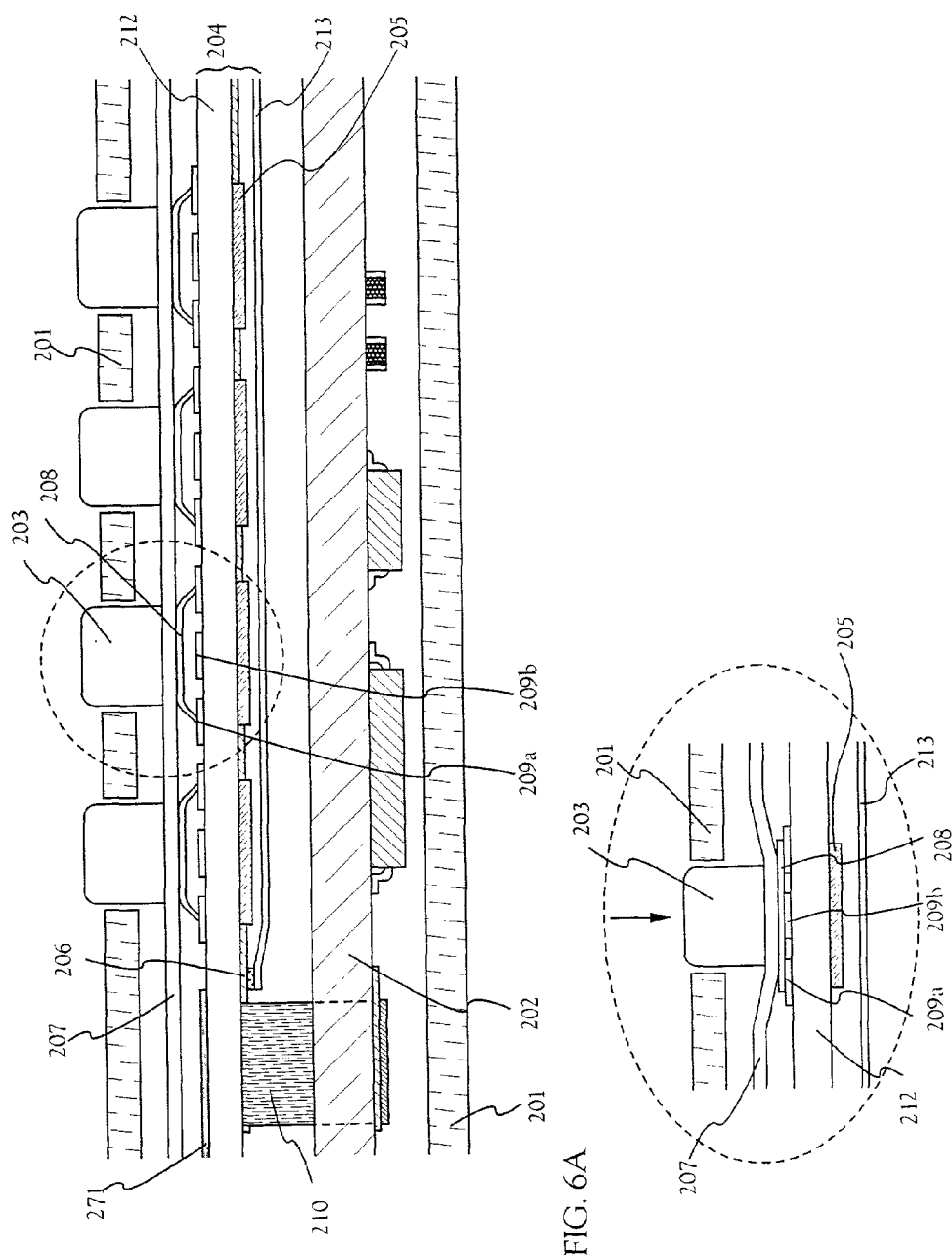

ELECTRONIC DEVICES

BACKGROUND OF THE INVENTION

1. Field of the Invention

This invention relates to electronic devices such as an information terminal, a cellular phone, a PHS (personal handy phone system) and a PDA (personal digital assistant) that are connected to the Internet to transmit and receive data. In this specification, the electronic device stands for those that can be carried by a user, and is capable of transmitting and receiving data and information indoors and outdoors through a wireless phone, a wired phone or an internet.

2. Description of the Related Art

Electronic devices as represented by a cellular phone (portable phone) are finding a rapid and widespread use owing to the establishment of an information communication network utilizing a wireless communications network and the Internet compounded by a decrease in the fees, in the cost of the device and convenience. The cellular phone includes a communication circuit, a display unit, an operation unit, a receiving unit, a transmitting unit and an antenna, which are integrally incorporated in a housing.

The electronic devices as represented by a cellular phone are selected by the users not only by their appearance and functions but also by their weight, duration in which they can be continuously used before recharging and the like. Therefore, a variety of contrivances have been made to lengthen the time of use through one time of electric charging yet decreasing the weight of the electronic device. As a result, functions which are considered unnecessary have been removed as much as possible.

Owing to the development in the communications technology in recent years, it is now becoming possible to transmit and receive electronic mails using electronic devices. However, complex operations are necessary for preparing a mail by manipulating the keys provided in the operation unit.

Further, the electronic device makes a communication by using wireless electromagnetic waves, and it often happens that the voice is heard with difficulty depending upon an environment in which the user is placed.

SUMMARY OF THE INVENTION

The invention disclosed in this specification is concerned with an electronic device having a first housing and a second housing which are coupled together by a hinge, wherein a first center line of the first housing and a second center line of the second housing are in parallel with each other only in a state where the first housing and the second housing are folded via the hinge.

The invention disclosed in this specification is concerned with an electronic device having a first housing and a second housing which are coupled together by a hinge, wherein each of the first and second housings has a pair of lines opposing each other, wherein one of the pair of lines has a shorter length than the other one of the pair of lines.

The invention disclosed in this specification is concerned with an electronic device having a first housing and a second housing which are coupled together by a hinge, wherein each of the first and second housings has a trapezoid shape.

This constitution makes it possible to simplify the operation of the keys. When the electronic device is used as a cellular phone, further, the transmitting unit can be brought close to the mouth, enabling the voice to be clearly transmitted to a remote user.

BRIEF DESCRIPTION OF THE DRAWINGS

FIGS. 1A to 1F are views illustrating the appearance of an electronic device according to the present invention;

FIGS. 2A to 2D are views illustrating the construction of a hinge according to the present invention;

FIGS. 4A and 4B are views illustrating a mode of operating the electronic device according to the present invention;

FIGS. 6A and 6B are views illustrating the arrangement of the printed board and a light-emitting device in the housing of Embodiment 1;

DESCRIPTION OF THE PREFERRED EMBODIMENTS

Figure 3A:
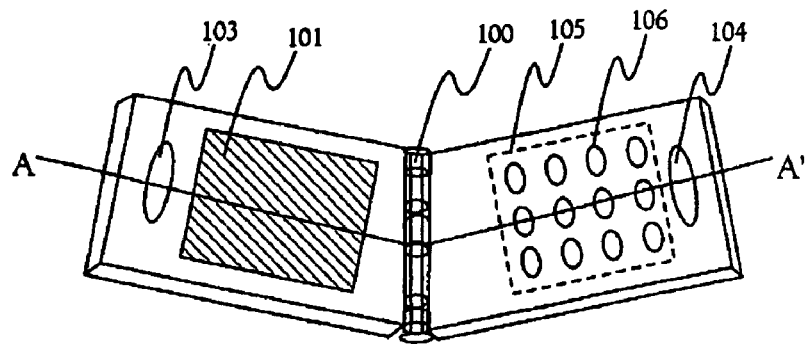
FIGS. 3A to 3E are views illustrating the arrangement of a printed board in a housing and the hinge of the present invention.

Embodiments of the invention will now be described.

FIGS. 1A to 1F are diagrams of a cellular phone which is an electronic device of this invention, wherein FIG. 1A is a diagram of when the electronic device having a first housing and a second housing coupled together by a hinge is opened from the inside, FIG. 1B is a view of when the electronic device of FIG. 1A is viewed from the side, and FIG. 1C is a view of when the electronic device is opened and is viewed from the outer side.

In FIGS. 1A to 1F, reference numeral 100 denotes a hinge, 104 denotes a receiving unit, 105 denotes an operation key, 106 denotes buttons, 101 denotes a display unit, and reference numeral 103 denotes a transmitting unit. In this specification, a plurality of buttons 106 are collectively called operation key 105. In this embodiment, further, the first housing includes the receiving unit 104, operation key 105 and buttons 106, and the second housing includes the display unit 101 and transmitting unit 103. As shown in FIGS. 1A-1C, each of the first and second housings has a pair of lines opposing each other, wherein one of the pair of lines has a shorter length than the other one. That is, each of the first and second housing has a trapezoid shape. The display unit 101 is provided with a liquid crystal display device or a light-emitting device. Further, the electronic device of the invention may be provided with a function for receiving the electromagnetic waves, such as an antenna or the like. The electronic device may be further provided with accessories (not shown) such as a strap, a shielding pad, etc. The receiving unit 104 and the transmitting unit 103 are incorporated in the first housing and in the second housing, respectively, the first hosing and the second housing being allowed to be folded via the hinge 100 to decrease the size. Since the device is foldable, a sufficient distance is maintained between the receiving unit 104 and the transmitting unit 103 from the standpoint of human engineering. In a state where the first housing and the second housing are opened via the hinge as shown in FIGS. 1A to 1C, the center line A of the first housing and the center line B of the second housing are inclined relative to each other and are not in parallel.

FIGS. 1D to 1F are illustrating a state where the first housing and the second housing of the electronic device shown in FIGS. 1A to 1C are folded via the hinge. FIG. 1D is a view of when the first housing and the second housing are folded, and the first housing is viewed from the upper side. It will be learned that the center line A of the first housing and the center line B of the second housing are in agreement and are in parallel. FIG. 1E is a view of when the electronic device of FIG. 1D is viewed from the side, from which it will be learned that the center line A and the center line B are in agreement and are in parallel. FIG. 1F is a view of when the second housing of the electronic device of FIG. 1D is viewed front the upper side. Like in FIG. 1D, the center line A of the first housing and the center fine B of the second housing are in agreement and are in parallel.

In this invention, the center lines of the housings stand for lines along which the center line A of the first housing and the center line B of the second housing are in parallel with each other in a state where the first housing and the second housing are folded via the hinge 100 as shown in FIGS. 1A to 1F. The center lines further stand for lines which are inclined relative to each other in a state where the first housing and the second housing are opened via the hinge 100. In FIGS. 1A to 1F, the housing of the electronic device of the invention has a shape surrounded by straight lines. The invention, however, is in no way limited thereto only but may have a shape surrounded by curves. Further, the electronic device shown in FIGS. 1A to 1F has the first housing and the second housing which are of the same shape. The invention, however, is in no way limited thereto only, and the first housing and the second housing may have different shapes.

FIGS. 2A to 2D illustrate the electronic device of the invention of before being coupled by the hinge 100 and after being coupled by the hinge 100. FIGS. 2A and 2B illustrate the device of before the first housing and the second housing are coupled together by the hinge 100, wherein FIG. 2B is a view of when the first housing and the second housing are opened from the inside and are viewed, and FIG. 2A is a side view of FIG. 2B. The first housing and the second housing have a plurality of cylinders 100a which are perforated on the inner side thereof. The hinge 100 is constructed by passing a rod 100b through the holes of the cylinders 100a to couple them together. In this specification, the cylinders 100a and the rod 100b in combination are referred as the hinge 100. The hinge 100 is not limited to the one of the shape shown in FIGS. 2A to 2D, but any widely known hinge can be applied to this invention.

FIGS. 2C and 2D are views showing the first housing and the second housing coupled together by the hinge 100, wherein FIG. 2D is a view of the first housing and the second housing coupled together by the hinge 100 and being opened from the inside, and FIG. 2C is a side view of FIG. 2D.

Figure 3B:
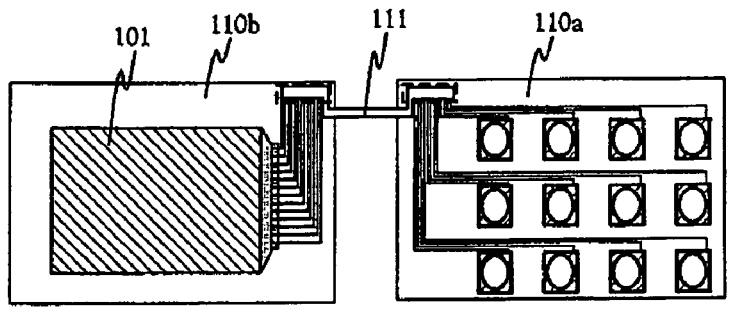

Next, described below with reference to FIGS. 3A to 3E is the arrangement of the printed board, FPC connecting the printed board and hinge 100 used for the electronic device of the invention. FIG. 3A illustrates the electronic device of the invention and FIG. 3B illustrates a printed board 110a in the first housing and a printed board 110b in the second housing. The printed board 110a and the printed board 110b are connected together by an FPC 111. The printed board 110a has a wiring for displaying the data input by buttons 106 on the display unit 101 of the second housing. The first housing and the second housing are connected together through the FPC 111, and the data input by buttons 106 are displayed on the display unit 101 of the second housing through the FPC 111. The printed boards 110a and 110b are further provided with a memory and a controller for controlling the receiving unit 104 and the transmitting unit 103 in addition to those shown in FIG. 2B, which, however, are not shown in FIG. 3B for simplifying the description.

Figure 3C:
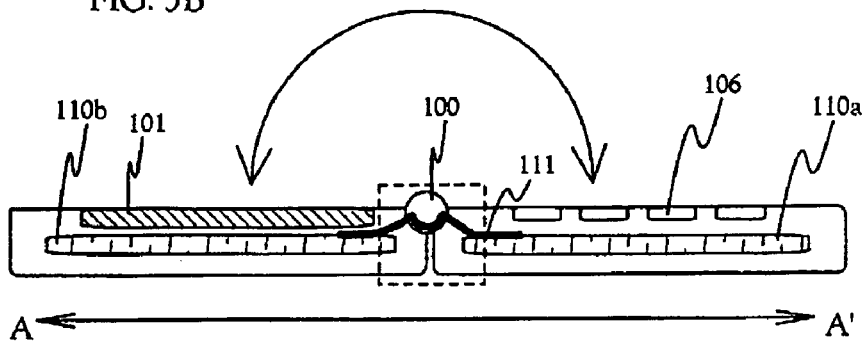

FIG. 3C is a sectional view of the electronic device cut along A-A' in FIG. 3A. The printed board 110a in the first housing and the printed board 110b in the second housing are coupled together through the hinge 100, the printed board 110a and the printed board 110b being connected together through the FPC 111. The FPC 111 is held in the hinge 100 permitting the first housing and the second housing to be folded via the hinge 100.

Figure 3D:
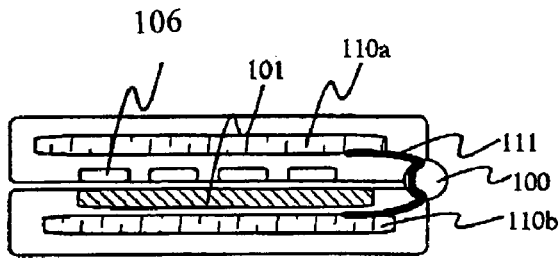
Figure 3E:
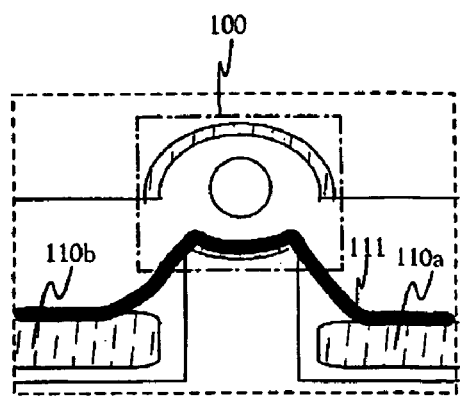

FIG. 3D illustrates a state where the first housing and the second housing are folded via the hinge 100, and FIG. 3E illustrates, on an enlarged scale, a portion surrounded by a dotted line of the electronic device of the invention shown in FIG. 3C. As shown in FIG. 3E, the FPC 111 is held in the hinge 100 to connect the printed board 110a and the printed board 110b together.

FIGS. 4A and 4B are views illustrating a mode of using the electronic device of this invention, wherein FIG. 4A is a view of when the operation key 105 is manipulated by the left hand, which is best suited for a left-handed person, and FIG. 4B is a view of when the operation key 105 is manipulated by the right hand, which is best suited for a right-handed person. Though the device is manipulated by one hand only in FIGS. 4A to 4B, the device may be manipulated by both hands, as a matter of course.

Figure 5A:
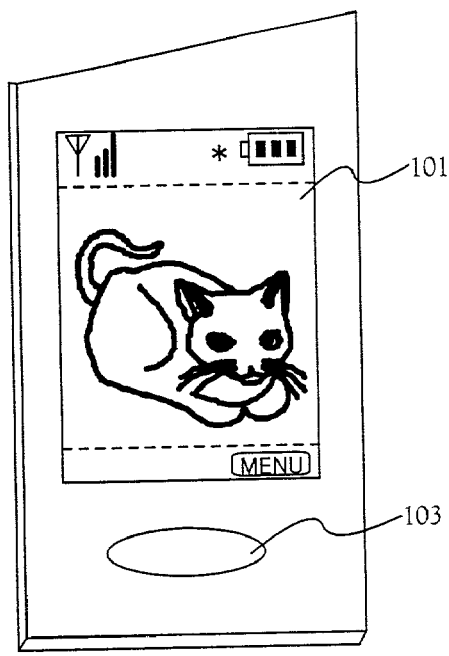
FIGS. 5A and 5B are views illustrating a mode of using a display unit according to the present invention.
Figure 5B:
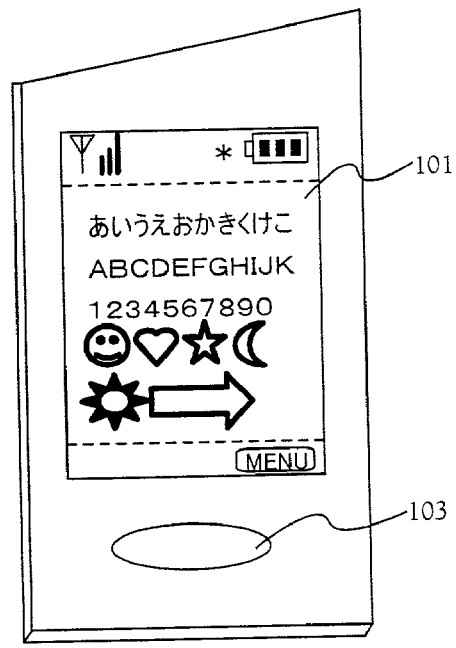

FIGS. 5A to 5B illustrate a housing having the display unit 101, wherein reference numeral 103 denotes the transmitting unit. FIG. 5A is a view illustrating a picture displayed on the display unit 101 and FIG. 5B is a view illustrating symbols such as letters, characters, alphabets, numerals and pictographs displayed on the display unit 101.

Embodiment 1

In the foregoing was described the case where the display device was used for the display unit only. In the electronic device of this embodiment, however, a display device is provided under the operation key 105. FIGS. 6A to 6B are sectional views illustrating the constitution of the operation key 105 under which the light-emitting device is provided.

In FIG. 6A, a printed board 202 made of a glass epoxy resin or a ceramic material exists inside the housing 201. As a base band unit, there are formed signal processing circuits such as CPU (microprocessor), DSP (digital signal processor) and various memories (flush memory and SRAM) as well as transmitting/receiving circuit unit mounting a mixer and a frequency synthesizer.

A light-emitting device 204 is provided on the surface of the printed board 202 on the side opposite to the surface on where the above various circuits are formed. The light-emitting device 204 includes a substrate 212, a unit display 205 and a covering member 213. The unit display 205 is arranged under each button 203.

The button 203 can be seen from the outer side of the housing 201 and permits light to pass through, and the light emitting device 204 is provided thereunder. Owing to this constitution, a symbol (character) displayed by the light-emitting device 204 can be seen through the light-transmitting (translucent) button 203.

The light-emitting device 204 is connected to the wiring 206 formed on the substrate 212. Though there is no particular limitation on the manner of connecting the circuit of the printed board 202 to the circuit of the substrate 212, the wiring 206 may be connected to the circuit of the printed board 202 by using, for example, an FPC (flexible printed circuit) 210. Reference numeral 271 indicates a connecting electrode.

Electrodes 209a and 209b, a diaphragm 208 and a flexible sheet 207 to which the diaphragm 208 is secured, are provided between the light-transmitting button 203 and the substrate 212. The diaphragm 208 is made of an alloy containing aluminum and copper as main components, and is electrically conducting. The diaphragm 208 is provided for the button 203. The electrodes 209a and 209b are connected to a circuit that detects the input among the above various circuits.

Referring to FIG. 6A, the diaphragm 208 in an ordinary state is in contact with the one electrode 209a only. When the user depresses the button 203 in the direction of an arrow as shown in FIG. 6B, the flexible sheet 207 and the diaphragm 208 undergo a change; i.e., the diaphragm 208 comes in contact with both electrodes 209a and 209b to establish a conducting state. Thus, the input data is obtained by detecting whether the button is operated.

Though the above embodiment has dealt with the case of using the light-emitting device, it is also allowable to use the reflection-type or the transmission-type liquid crystal display device as the display device.

This embodiment can be used in free combination with the mode of use.

Embodiment 2

Figure 7:
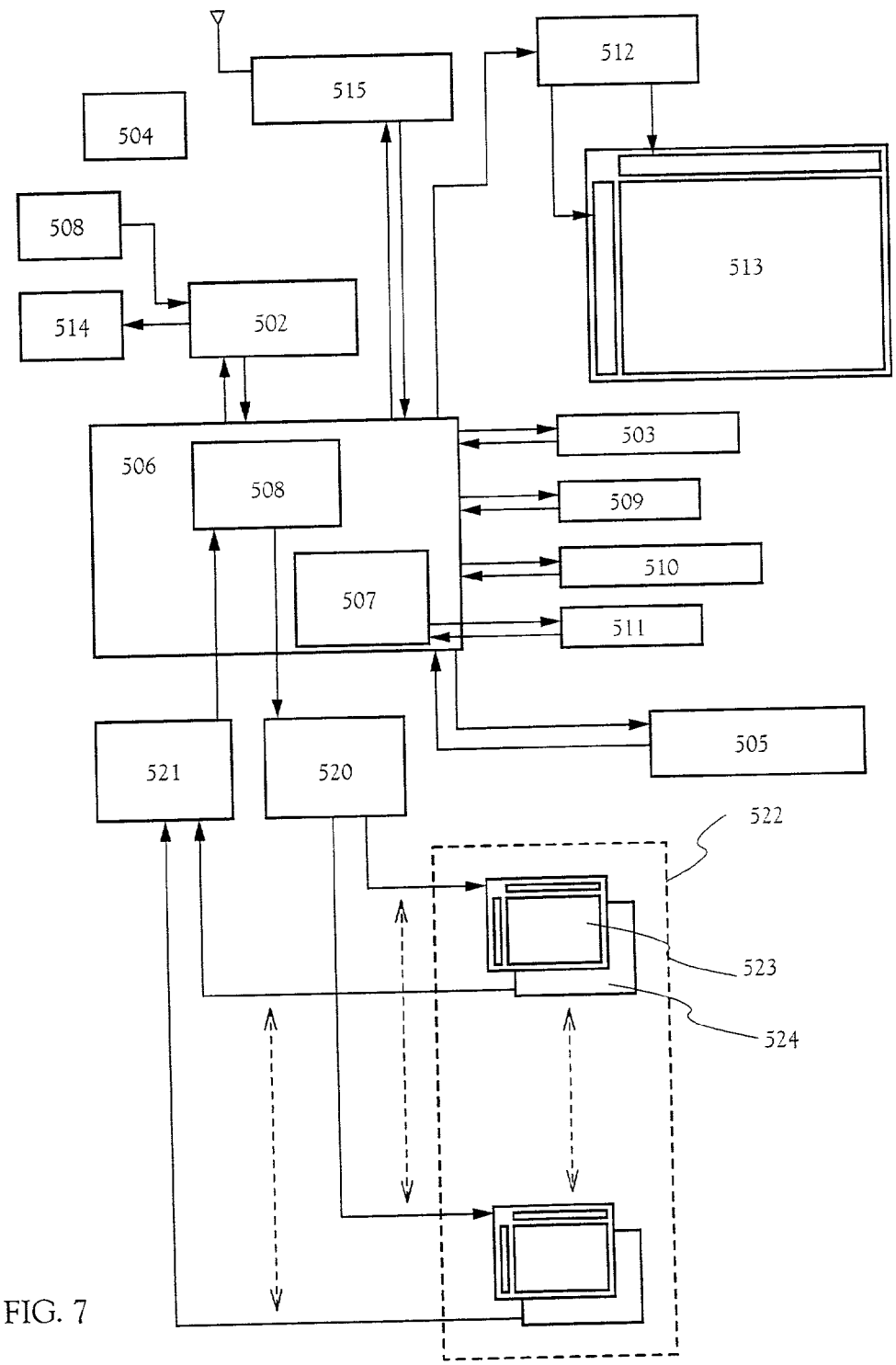
FIG. 7 is a system block diagram of the electronic device of Embodiment 2.

FIG. 7 is a block diagram illustrating a system using the electronic device of the invention. In the system shown in FIG. 7, a key input unit 522 includes a display device 523 and a key input detector unit 524. A keyboard interface unit 508 in a CPU 506 controls the picture of symbols displayed by the display device 523 via a keyboard control circuit (controller) 520.

A signal from the key input detector unit 524 is input to the keyboard interface unit 508 via an input signal processing circuit 521, whereby the data is processed in the CPU 506, a predetermined data is output to the control circuit 512, and the data is displayed on the display device 513 or is transmitted.

The external circuit is constituted by a power source 504 which includes a stabilized power source and a high-speed and high-precision operational amplifier, a voice processing circuit 502, an external interface port 505, and a transmitting/receiving circuit 515. The CPU 506 contains a video signal processing circuit 507. To the CPU 506 are connected VRAM 511, DRAM 509, flush memory 510 and memory card 503. The data processed by the CPU 506 is sent as a video signal (data signal) to the control circuit 512 from the video signal processing circuit 507. The control circuit 512 supplies a video signal and a clock to the display device 513. Concretely speaking, the control circuit has a function for distributing the video signals into data corresponding to the pixels in the display device, and a function for converting the horizontal synchronizing signals and vertical synchronizing signals input from the external unit into start signals for the drive circuit and into timing control signals for alternating the current in the embedded power-source circuit. In addition, a microphone 508 and a speaker 514 are also included in this system.

Referring to FIG. 7, the electronic device of this invention is so constituted that the display devices provided under the buttons are controlled solely by the CPU.

This embodiment can be used in free combination with the mode of use and with the embodiment 1.

Embodiment 3

Figure 8A:
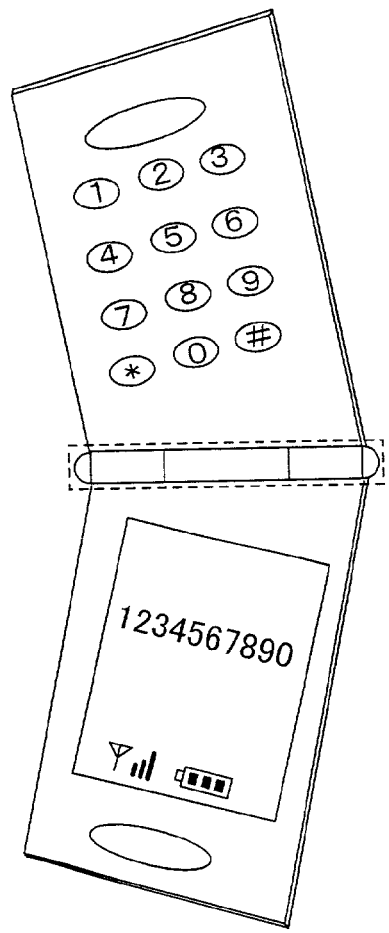
FIGS. 8A and 8B are views illustrating a mode of using the electronic device of Embodiment 3.
Figure 8B:
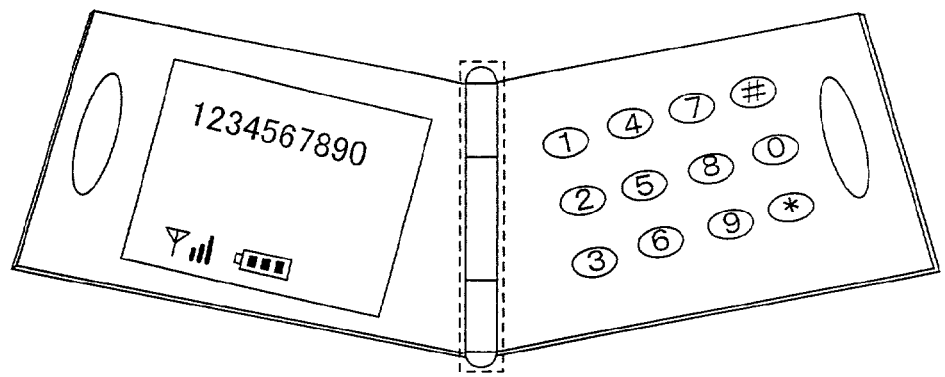

Next, FIGS. 8A to 8B show the appearance of the electronic device using the display device for the operation key dealt with in the embodiments 1 and 2. FIG. 8A illustrates a case where, when the first housing and the second housing are arranged in the vertical direction, the direction of symbols displayed on the display unit 101 and the direction of symbols displayed on the buttons 106 in the operation key 105, are in what they should be as viewed from the side of the user.

FIG. 8B illustrates a case where, when the first housing and the second housing are arranged in the lateral direction, the direction of symbols displayed on the display unit 101 and the direction of symbols displayed on the buttons 106 in the operation key 105, are in what they should be as viewed from the side of the user.

The electronic device of the invention is capable of changing the direction of the symbols displayed on the display unit 101 and the direction of the symbols displayed on the buttons 106 in the operation key 105 over to the direction shown in FIG. 8A and over to the direction shown in FIG. 8B to meet the user's choice.

In the foregoing was described the case where the direction of pictures displayed on the display unit 101 was the same as the direction of symbols displayed on the operation key 105 with reference to FIGS. 8A to 8B. The invention, however, is in no way limited thereto only. The direction of pictures displayed on the display unit 101 may be different from the direction of symbols displayed on the operation key 105. The symbols displayed by the operation key 105 shown in FIGS. 8A to 8B are only some examples of the symbols, and the electronic device of this invention is not limited to these symbols only.

Further, the direction of pictures displayed on the display unit 101 and the direction of pictures such as symbols displayed on the operation key 105, may be automatically changed relying upon the angle θ in the connection portion 100 between the surface of the first housing having the display unit 101 and the surface of the second housing having buttons 106 in the operation key 105.

Further, the brightness of display of the operation key 105 may be changed. The operation key 105 shown in FIG. 9A displays one or a plurality of black symbols on a white background. The operation key 105 shown in FIG. 9B displays one or a plurality of white symbols on a black background.

Figure 9A:
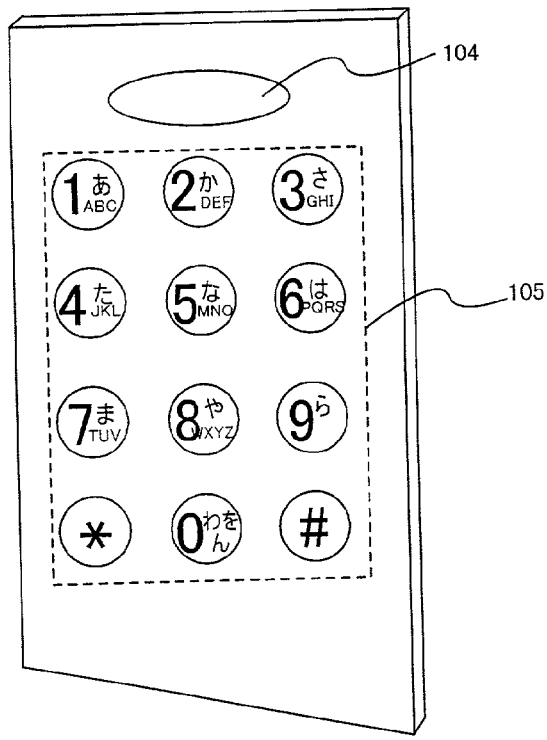
FIGS. 9A and 9B are views illustrating a mode of using the electronic device of Embodiment 3.
Figure 9B:
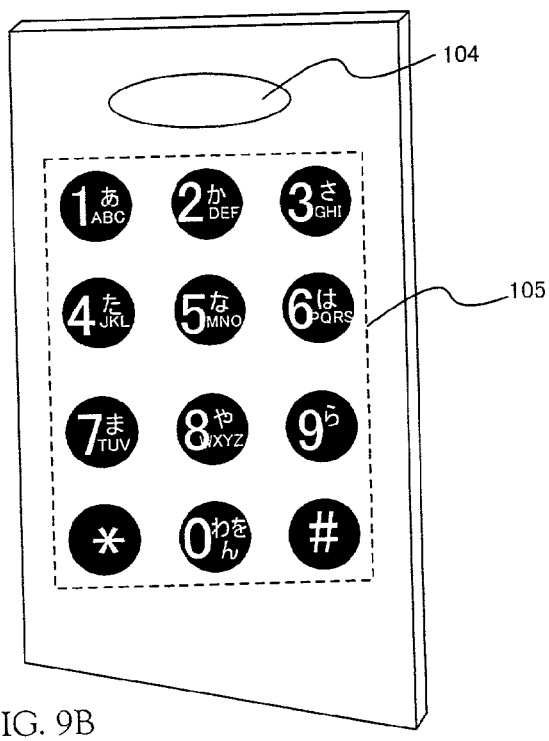

Though FIGS. 9A and 9B have illustrated the operation keys producing a black display and a white display, it should be noted that the invention is not limited to these constitutions only. The operation key may produce a display of a color other than white. For example, a yellow display may be made on the black background, a green display may be made on the white background or a black display may be made on the blue background.

Owing to the above constitution, the electronic device consumes the electric power in suppressed amounts.

This embodiment can be used in free combination with the mode of use and with the embodiments 1 and 2.

Embodiment 4

In this embodiment, an example of a display device used in a display portion 101 or provided under an operation key is shown. In this embodiment, a liquid crystal display device will be described as a display device. An example of the liquid crystal display device having a pixel portion and a driver circuit for driving it on a substrate with an insulating surface (note that it is in a state before a liquid crystal material sealing) is shown in FIG. 10.

Note that a CMOS circuit as a basic unit is shown as the driver circuit and one pixel is shown as the pixel portion.

Figure 10:
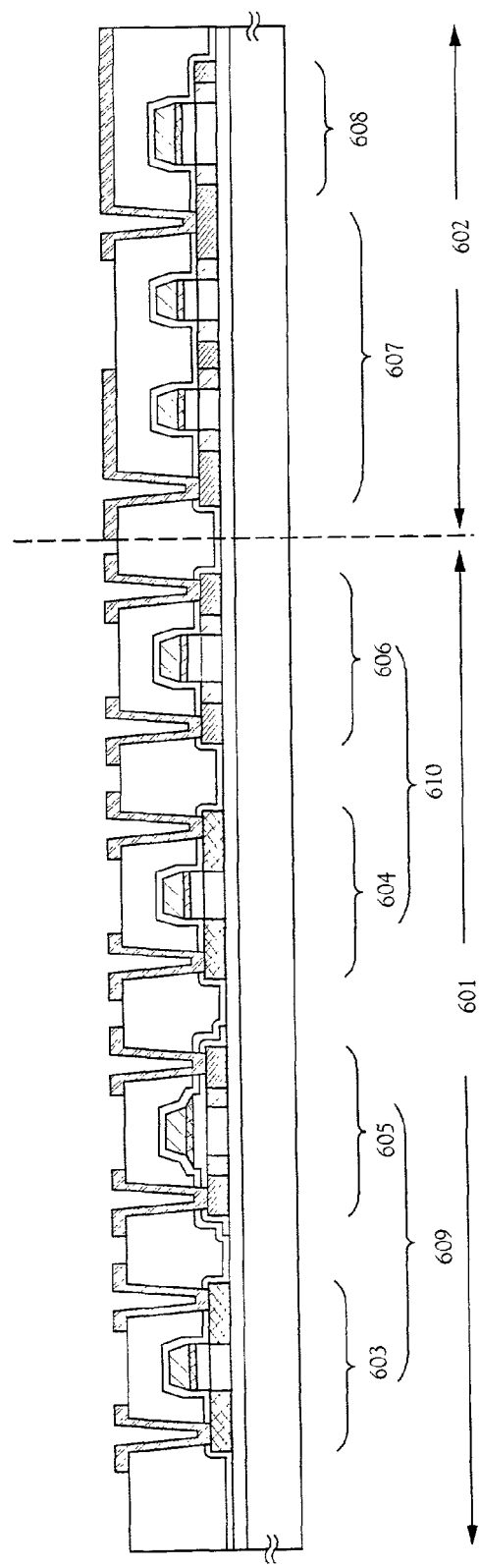
FIG. 10 is a sectional view of an active matrix liquid crystal display device of Embodiment 4.

In FIG. 10, a driver circuit 601 composed of n-channel TFTs 605 and 606 and p-channel TFTs 603 and 604 and a pixel portion 602 composed of a pixel TFT 607 as an n-channel TFT and a storage capacitor 608 are formed on a substrate. In the driver circuit 601, combining n-channel TFTs and p-channel TFTs, a logic circuit 609 and a sampling circuit 610 are also formed.

The pixel TFT 607 has a structure (double gate structure) where two channel forming regions are located between a source region and a drain region. However, this embodiment is not limited to the double gate structure. A single gate structure where one channel forming region is formed or a triple gate structure where three channel forming regions are formed may be used.

Also, in this embodiment, a pixel electrode connected with the drain region of the pixel TFT 607 is formed as a reflection electrode. As the material of the pixel electrode, it is desirable that a material with superior reflectivity, such as a film containing mainly Al or Ag or a laminate film of these be used. Also, it is preferable that after the formation of the pixel electrode, its surface is made uneven by a process using a sandblast method, an etching method, or the like, which is known. Thus, mirror reflection is prevented and reflection light is scattered to increase the degree of whiteness.

Note that in this embodiment, the example of the reflection liquid crystal display device using the reflection electrode as the pixel electrode is shown. However, a transmission liquid crystal display device using a transparent conductive film as the pixel electrode instead of the reflection electrode may be used.

After the state in FIG. 10 is obtained, an orientation film is formed on the pixel electrode and then rubbing processing is performed. Note that in this embodiment, before the formation of the orientation film, an organic resin film such as an acrylic resin film is patterned to form column-shaped spacers for keeping a substrate interval in predetermined positions. Instead of the column-shaped spacers, spherical spacers may be dispersed over the entire surface of the substrate.

Next, a counter (opposite) substrate is prepared. After colored layers and a light shielding layer are formed on the counter substrate, a planarization film is formed. Then, a counter electrode made of a transparent conductive film is formed in at least the pixel portion on the planarization film, an orientation film is formed on the entire surface of the counter substrate, and rubbing processing is performed.

Then, a stainless substrate in which the pixel portion 602 and the driver circuit 601 are formed and a fixing substrate are adhered to each other through an adhesion layer (seal member in this embodiment). Fillers are mixed with the adhesion layer. The two substrates are adhered to each other at a uniform interval by the fillers and the column-shaped spacers. After that, a liquid crystal material is injected between both substrates and completely seated using a sealing agent (not shown). A known liquid crystal material may be used as the liquid crystal material.

Next, after the liquid crystal sealing (or filling) process is completed, a substrate holder is separated as described in the embodiment mode and in Embodiment 1. A state of the liquid crystal display device after that will be described using FIG. 11.

Figure 11:
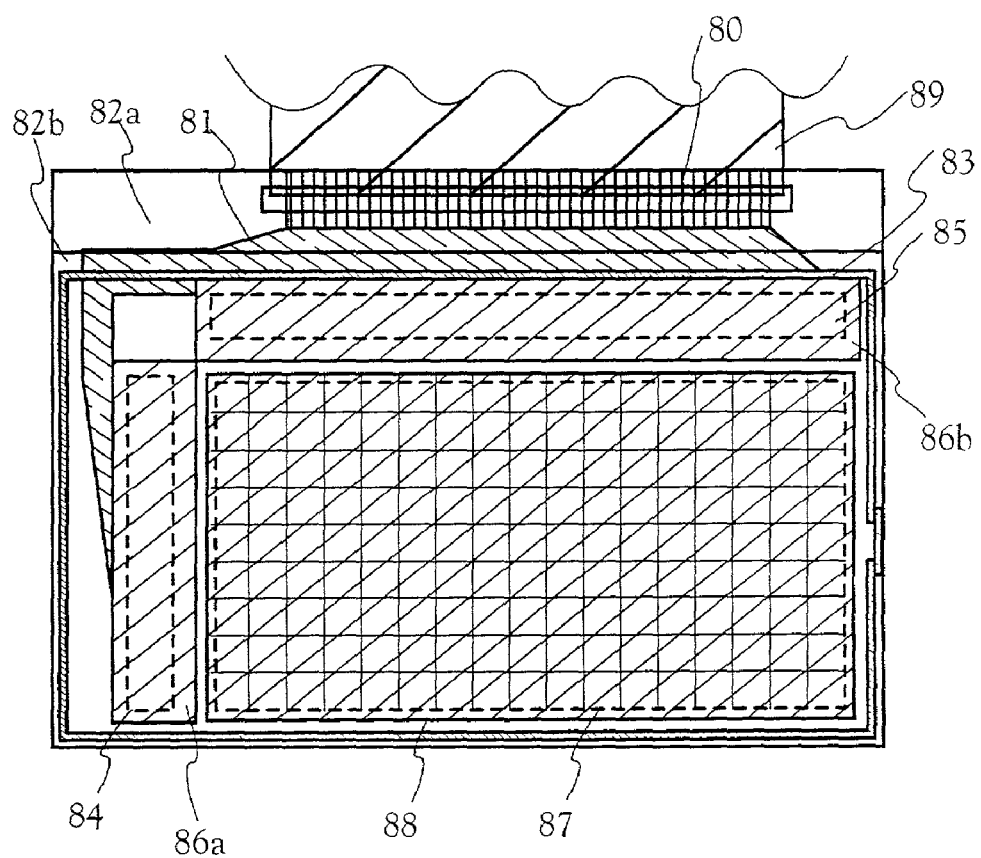
FIG. 11 is a view illustrating the appearance of the active matrix liquid crystal display device of Embodiment 4.

In the top view shown in FIG. 11, a stainless substrate 82a and a counter substrate 82b on which a color filter and the like are provided are adhered to each other through a seal member 83. In the stainless substrate 82a, a pixel portion, driver circuits, an external input terminal 80 to which an FPC (flexible printed circuit) 89 is adhered, wiring 81 for connecting the external input terminal with input portions of the respective circuits, and the like are formed.

A light shielding layer 86a is provided on the counter substrate side so as to overlap a gate side driver circuit 84 and a light shielding layer 86b is provided on the counter substrate side so as to overlap a source side driver circuit 85. Also, in a color filter 88 which is provided on the counter substrate on a pixel portion 87, the light shielding layers and colored layers of respective colors of red (R), green (G), and blue (B) are provided corresponding to each pixel. In actual display, color display is made by three colors of the red (R) colored layer, the green (G) colored layer, and the blue (B) colored layer. The colored layers of the respective colors are arbitrarily arranged.

In this embodiment, the color filter 88 is provided in the counter substrate for colorization. However, in particular, the present invention is not restricted to this. When an element is formed on a substrate, a color filter may be formed over the substrate.

Also, the light shielding layer is provided between adjacent pixels in the color filter to light-shield a portion except for a display region. Further, the light shielding layers 86a and 86b are provided in a region covering the driver circuits. However, when the liquid crystal display device is incorporated as the display portion of the electronic equipment, the region covering the driver circuits is covered with a cover. Thus, a structure where the shielding layers are not provided may be used. When a necessary element is formed on a substrate, light shielding layers may be formed on the substrate.

Also, without providing the above light shielding layers, the colored layers composing the color filter may be suitably arranged between the counter substrate and the counter electrode such that light shielding is made with a laminate layer in which a plurality of layers are laminated. Thus, a portion (gap between respective pixel electrodes) except for the display region and the driver circuits are light-shielded.

Also, an FPC 89 made of a base film and wiring is adhered to the external input terminal through an anisotropic conductive resin. A reinforced plate is further provided to improve the mechanical strength.

Also, a polarization plate (not shown) is adhered to only the counter substrate.

The liquid crystal display device thus manufactured can be used as a display portion of electronic equipments used in this invention.

Figure 12A:
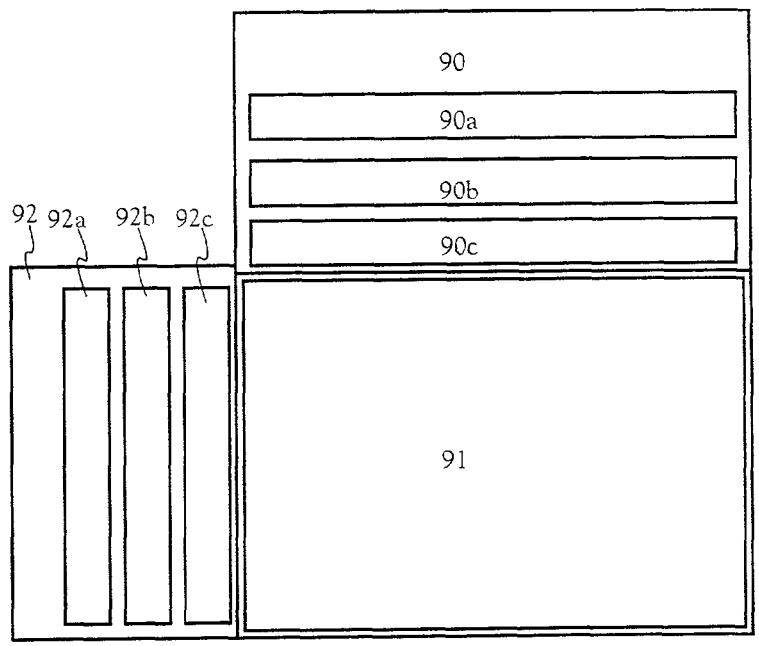
FIGS. 12A and 12B are block diagrams of a drive circuit in the active matrix liquid crystal display device of Embodiment 4.
Figure 12B:
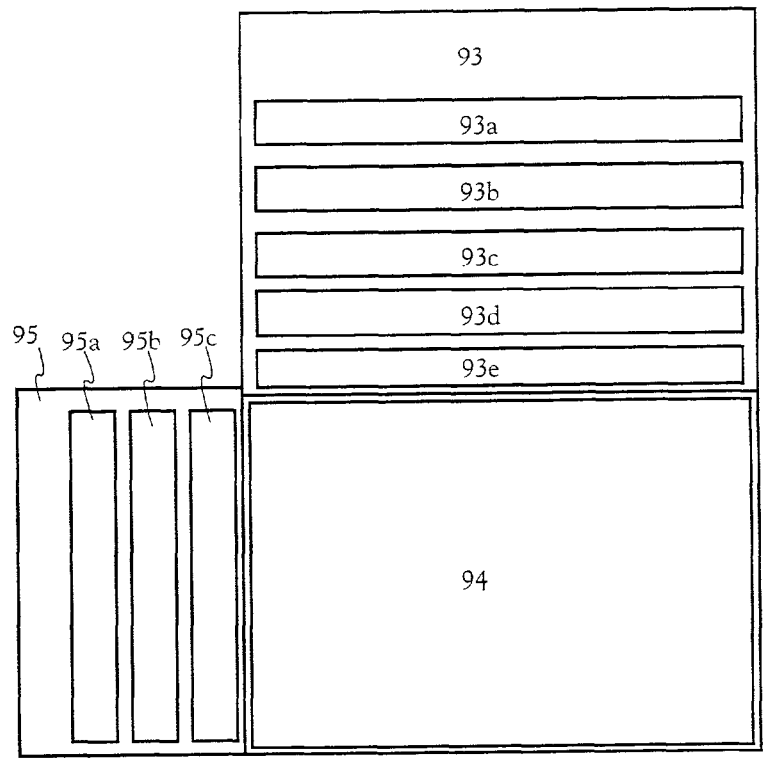

An example of a circuit structure of the liquid crystal display device of this embodiment is shown in FIGS. 12A and 12B.

First, a circuit structure for analog drive will be explained by using FIG. 12A. In this embodiment, the liquid crystal display device has a source side driver circuit 90, a pixel portion 91, and a gate side driver circuit 92. Note that the term driver circuit in this specification covers the source side driver circuit and the gate side driver circuit.

In the source driver circuit 90, a shift register 90a, a buffer 90b, and a sampling circuit (transfer gate) 90c are provided. Also, in the gate side driver circuit 92, a shift register 92a, a level shifter 92b, and a buffer 92c are provided. If necessary, a level shifter circuit may be provided between the sampling circuit and the shift register.

Also, in this embodiment, the pixel portion 91 includes a plurality of pixels and a TFT element is provided for the respective pixels. Note that the source side driver circuit 90 and the gate side driver circuit 92 can be formed using p-channel TFTs or n-channel TFTs.

Note that, although not shown, another gate side driver circuit may be provided on the opposite side of the gate side driver circuit 92 with the pixel portion 91 therebetween.

Next, a circuit structure for digital drive will be explained by using FIG. 12B. In the case of digital drive, as shown in FIG. 12B, instead of the sampling circuit, a latch (A) 93b and a latch (B) 93c may be provided. In a source side driver circuit 93, a shift register 93a, the latch (A) 93b, the latch (B) 93c, a D/A converter 93d, and a buffer 93e are provided. Also, in the gate side driver circuit 95, a shift register 95a, a level shifter 95b, and a buffer 95c are provided. If necessary, a level shifter circuit may be provided between the latch (B) 93c and the D/A converter 93d.

Also, although only the structures of the pixel portion 91 or 94 and the driver circuit are described in this embodiment, a memory or a microprocessor further may be formed.

Note that this embodiment can be combined the embodiment mode and Embodiments 1 to 3.

Embodiment 5

Figure 13A:
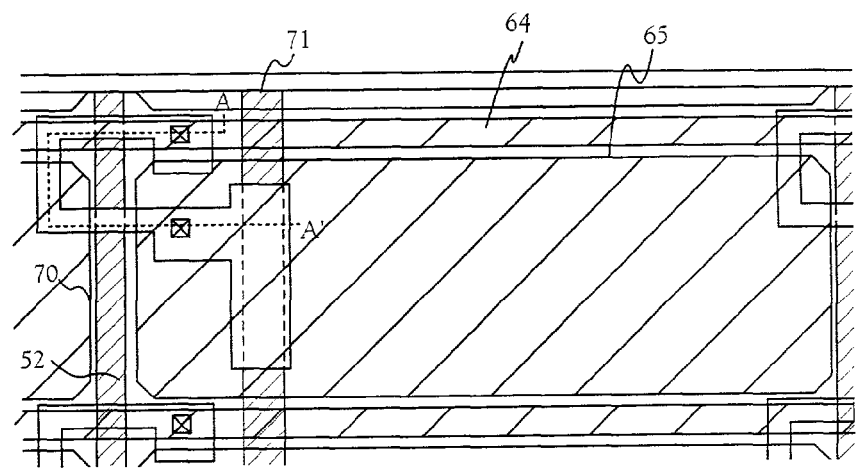
FIGS. 13A and 13B are a top view and a sectional view of the active matrix liquid crystal display device of Embodiment 5.

In this embodiment, an example, in which the TFT for a pixel portion and driver circuits of the liquid crystal display device used in a display portion of electronic equipments of this invention is formed by an inverted stagger TFT, will be described using FIGS. 13A and 13B. FIG. 13A is a top view in the case where one of pixels in the pixel portion is enlarged and a sectional view taken along a dot line A-A' in FIG. 13A is shown in FIG. 13B.

Figure 13B:
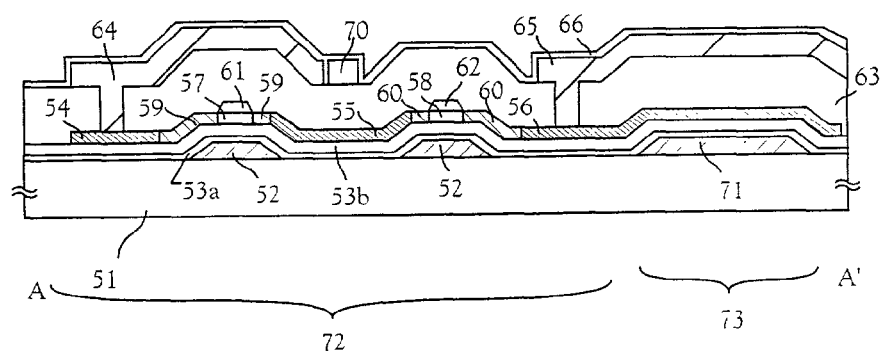

In FIG. 13B, reference numeral 51 denotes a substrate having an insulating surface. A pixel TFT portion 72 is formed of n-channel TFTs. A gate electrode 52 is formed on a substrate 51, and a first insulating film 53a of silicon nitride and a second insulating film 53b of silicon oxide are provided thereon. As active layers on the second insulating film 53b, n$^+$ type regions 54 to 56, channel forming regions 57 and 58, and n$^-$ type regions 59 and 60 located between the n$^-$ type regions and the channel forming regions are formed. The channel forming regions 57 and 58 are protected by insulating layers 61 and 62. After contact holes are formed in a first interlayer insulating film 63 which covers the insulating layers 61 and 62 and the active layers, wiring 64 connected with the n$^+$ type region 54 is formed, a pixel electrode 65 of Al, Ag, or the like is connected with the n$^-$ type region 56. Reference numeral 70 denotes a pixel electrode.

Note that in this embodiment, the gate wiring of the pixel TFT in the pixel portion is formed in a double gate structure. However, a multi-gate structure such as a triple gate structure may be used in order to reduce a variation in an off current. Further, a single gate structure may be used to improve an aperture ratio.

Also, a capacitor portion 73 in the pixel portion is composed of the first insulating film 53a and the second insulating film 53b as dielectric, capacitor wiring 71, and the n$^-$ type region 56.

Note that the pixel portion shown in FIGS. 13A and 13B is merely shown as one example, and the present invention is not restricted to the above structure in particular.

Note that this embodiment can be combined the embodiment mode and Embodiments 1 to 4.

Embodiment 6

In this embodiment, an example of a display device used in a display portion 101 or provided under an operation key will be described. In this embodiment, a light emitting device used as a display device will be explained.

Figure 14:
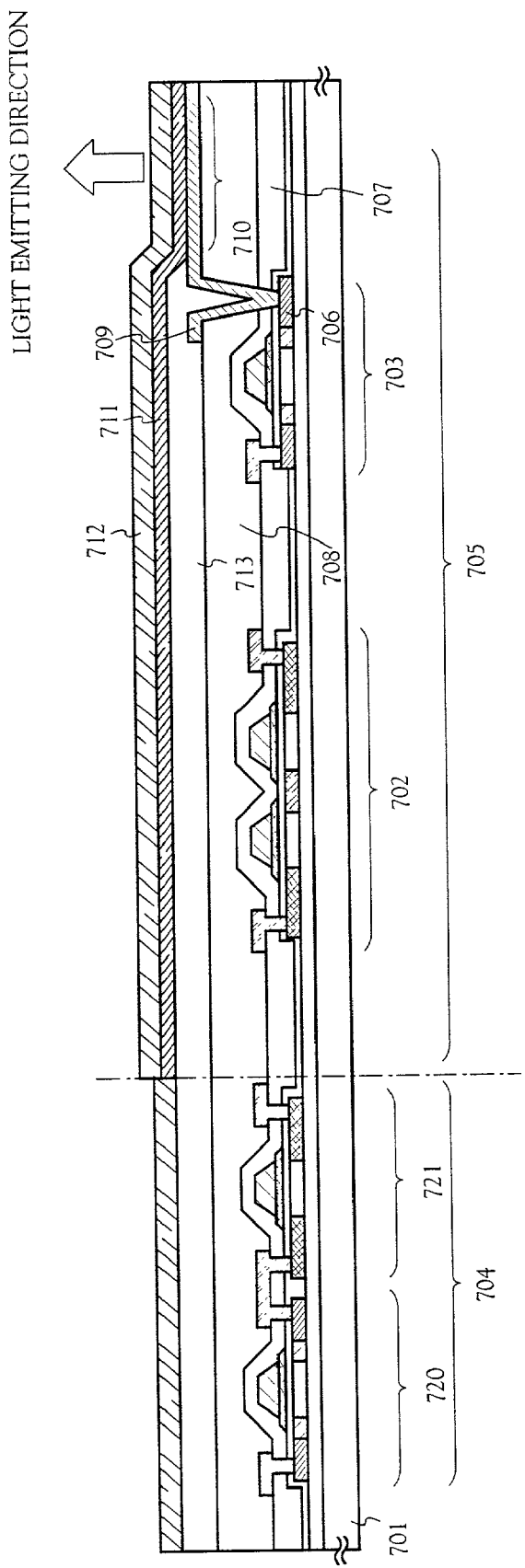
FIG. 14 is a sectional view of the light-emitting device of Embodiment 6.

An example of a light emitting device having a pixel portion 705 and a driver circuit 704 for driving it on the same substrate (note that a state before sealing) is shown in FIG. 14. Note that a CMOS circuit as a basic unit is shown in the driver circuit 704 and one pixel is shown in the pixel portion 705.

In FIG. 14, reference numeral 701 denotes a substrate. An insulating film is formed on the substrate. A driver circuit 704 composed of an n-channel TFT 720 and a p-channel TFT 721, and a pixel portion 705 comprising a switching TFT 702 composed of the a p-channel TFT and a current control TFT 703 composed of an n-channel TFT are formed thereon. Also, in this embodiment, all TFTs are formed as top gate TFTs.

Also, the switching TFT 702 has a structure (double gate structure) where two channel forming regions are located between a source region and a drain region. However, this embodiment is not restricted to the double gate structure. A single gate structure where one channel forming region is formed or a triple gate structure where three channel forming regions are formed may be used.

Also, before a second interlayer insulating film 708 is provided, a contact hole is provided in a first interlayer insulating film 707 on a drain region 706 of the current control TFT 703. This is because an etching process is simplified in the case where a contact hole is formed in the second interlayer insulating film 708. The contact hole is formed in the second interlayer insulating film 708 so as to reach the drain region 706 and a pixel electrode 709 connected with the drain region 706 is provided. The pixel electrode 709 is an electrode which functions as the cathode of a light-emitting element and formed using a conductive film containing an element belonging to group 1 or 2 of the periodic table. In this embodiment, a conductive film made of a compound of lithium and aluminum is used.

Reference numeral 713 denotes an insulating film provided to cover end portions of the pixel electrode 709 and this insulating film is called a bank in this specification. The bank 713 may be formed using an insulating film containing silicon or a resin film. In the case where the resin film is used, when a carbon particle or a metal particle is added to the resin film such that resistivity thereof becomes $1\times10^6$ to $1\times10^{12}$ $\Omega$m (preferably, $1\times10^8$ to $1\times10^{10}$ $\Omega$m), the occurrence of dielectric breakdown at film formation can be suppressed.

Also, a light-emitting element 710 is composed of the pixel electrode (cathode) 709, an organic compound layer 711, and an anode 712. As the anode 712, a conductive film having a large work function, typically an oxide conductive film is used. As the oxide conductive film, indium oxide, tin oxide, zinc oxide or a compound of these may be used. The light emitting device of this embodiment becomes a light emitting device for emitting light upward. Note that this embodiment is not restricted to the light emitting device for emitting light upward. If the structure of the light emitting device is suitably modified, the light emitting device for emitting light downward can be obtained.

Note that a laminate in which a hole injection layer, a hole transport layer, a hole blocking layer, an electron transport layer, an electron injection layer, or an electron blocking layer is combined with a luminescent layer is defined as an organic compound layer in this specification. Also, if an organic compound material is used, the luminescent layer is not limited to a specific material. For example, a thin film made of a luminescent material (singlet compound) for luminescence by singlet excitation or a thin film made of a luminescent material (triplet compound) for luminescence by triplet excitation can be used.

Note that, although not shown here, after the anode 712 is formed, it is effective that a passivation film is provided so as to completely cover the EL layer 710. As the passivation film, an insulating film including a carbon film, a silicon nitride film, or a silicon oxynitride film as a single layer, or a laminate layer of those is used.

Next, a process up to a sealing (or filling) process for protecting the light-emitting element is performed. The EL display device after the process will be described using FIGS. 15A and 15B.

Figure 15A:
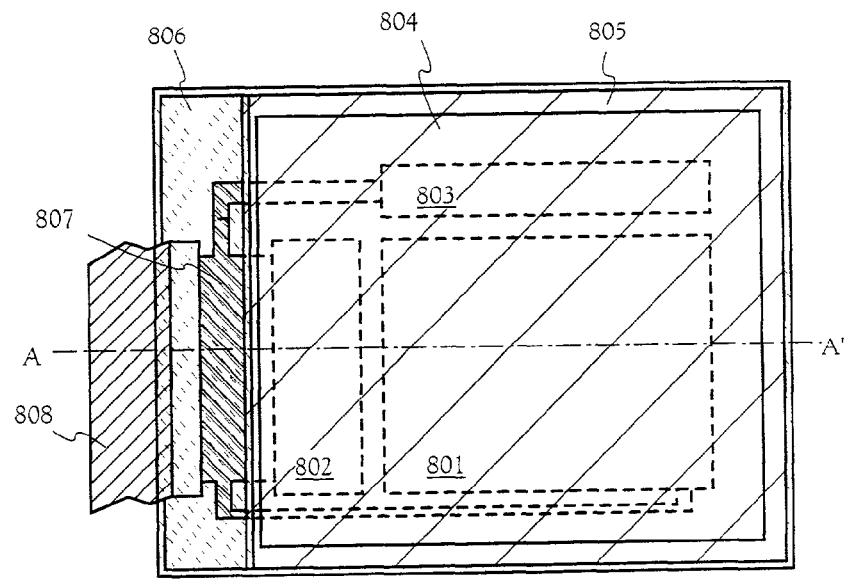
FIGS. 15A and 15B are a top view and a sectional view of the light-emitting device of Embodiment 6.
Figure 15B:
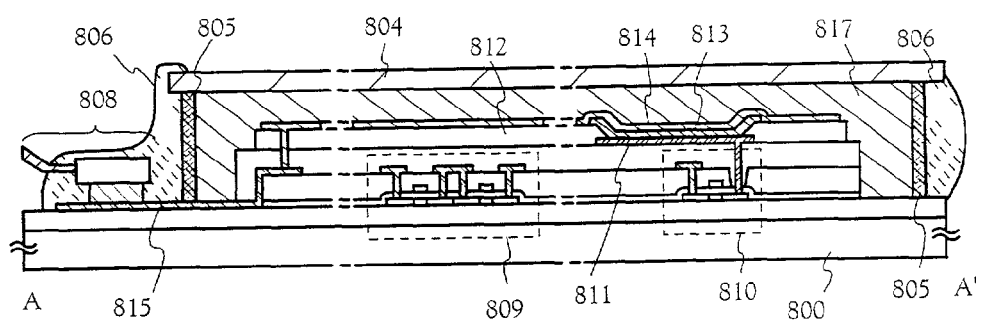

FIG. 15A is a top view showing a state where a process up to sealing of the EL element is performed and FIG. 15B is a cross sectional view taken along a line A-A' in FIG. 15A. As shown by dot lines, reference numeral 801 denotes a pixel portion, numeral 802 denotes a source side driver circuit, and numeral 803 denotes a gate side driver circuit. Also, reference numeral 804 denotes a cover member, numeral 805 denotes a first seal member, and numeral 806 denotes a second seal member.

Note that reference numeral 808 denotes FPC, and 807 is a wiring for transmitting signals to be inputted to the source side driver circuit 802 and the gate side driver circuit 803. Note that, although only the FPC is shown in FIGS. 15A and 15B, a printed wiring board (PWB) may be attached to the FPC.

Next, the cross sectional structure will be described using FIG. 15B. The pixel portion and the source side driver circuit 809 are formed over a substrate 800. The pixel portion is composed of a plurality of pixels. Each of the pixels includes a current control TFT 810 and a pixel electrode 811 electrically connected with the drain thereof. The source side driver circuit 809 is constructed using a CMOS circuit in which an n-channel TFT and a p-channel TFT are combined with each other. Note that a polarization plate (typically a circular polarization plate) may be attached to the substrate 800.

Banks 812 are formed at both ends of the pixel electrode 811 and an organic compound layer 813 and an anode 814 of the light-emitting element are formed on the pixel electrode 811. The anode 814 also function as wiring common to all pixels and is electrically connected with an FPC 808 through a connection wiring 815. Further, all elements included in the pixel portion and the source side driver circuit 809 are covered with a passivation film (not shown).

Also, the cover member 804 is adhered to the substrate 800 through the first seal member 805. Note that spacers may be provided to secure an interval between the cover member 804 and the EL element constant. A gap (space) 817 is produced inside the first seal member 805 and the substrate 800. It is desirable that the first seal member 805 is a material to which moisture or oxygen is not transmitted. It is effective that a substance having a hygroscopic effect or a substance having an antioxidant effect is provided in the gap 817.

A carbon film (specifically, a diamond like carbon film) is preferably provided as a protective film on the front surface and the rear surface of the cover member 804 with a thickness of 2 to 30 nm. Such a carbon film (not shown here) has the functions of preventing penetration of oxygen and water and mechanically protecting the surface of the cover member 804.

After the adhesion of the cover member 804, the second seal member 806 is provided so as to cover the exposed surface of the first seal member 805. The same material as the first seal member 805 can be used for the second seal member 806.

When the light-emitting element is filled with the above structure, the light-emitting element can be completely shielded from the exterior and the penetration of a substance which causes deterioration of the organic compound layer by oxidation, such as moisture or oxygen, from the exterior can be prevented. Therefore, the light emitting device having high reliability is obtained.

Note that this embodiment can be combined the embodiment mode and Embodiments 1 to 5.

Embodiment 7

This embodiment deals with a case where a photoelectric conversion element (photodiode) is incorporated in each pixel of the display device. In this embodiment, each pixel in the light-emitting device has a photoelectric conversion element incorporated therein.

Figure 16:
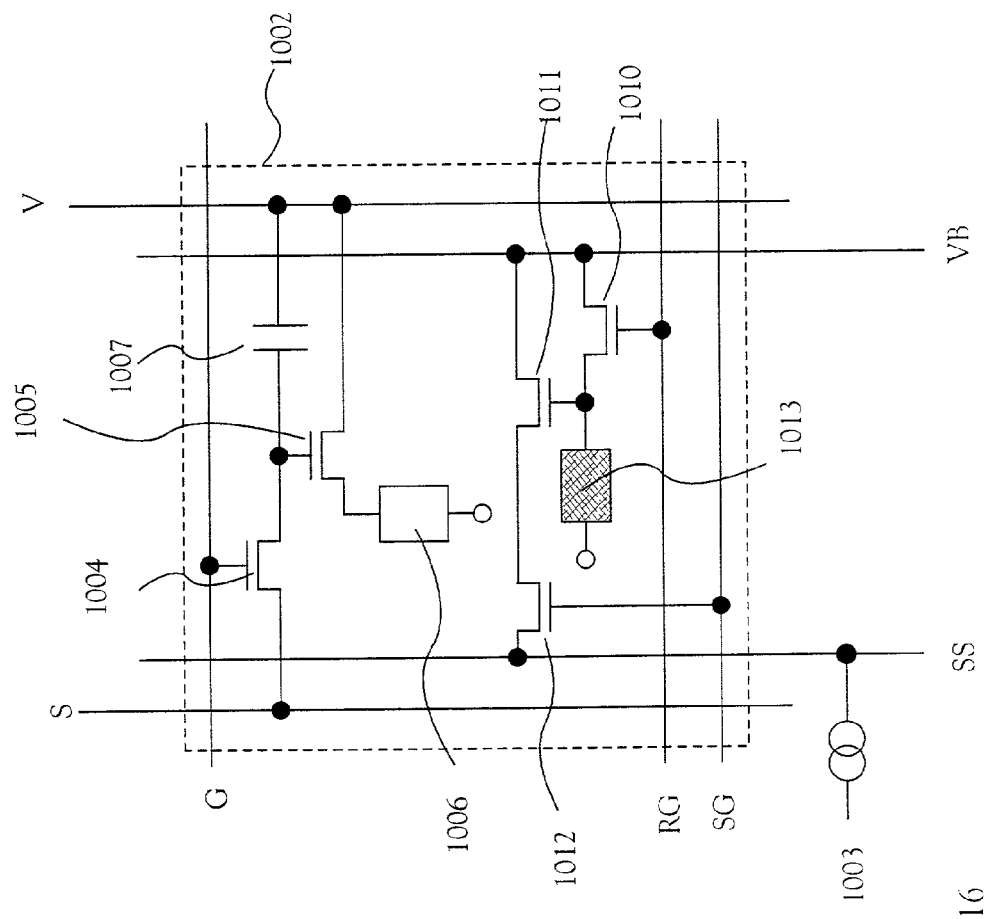
FIG. 16 is a circuit diagram of a pixel having a sensor (photodiode) of Embodiment 7.

FIG. 16 closely illustrates the constitution of a pixel 1002. A region surrounded by a dotted line represents the pixel 1002.

The pixel 1002 includes a switching TFT 1004, a driving TFT 1005 and a light-emitting element 1006. In FIG. 16, the pixel 1002 is provided with a capacitor 1007. The capacitor 1007, however, may not be provided.

The light-emitting element 1006 comprises an anode, a cathode and an organic compound layer provided between the anode and the cathode. When the cathode is connected to the source region or the drain region of the driving TFT 1005, the anode works as an opposing electrode, the cathode works as a pixel electrode, and light is emitted toward the lower direction. Conversely, when the anode is connected to the source region or the drain region of the driving TFT 1005, the anode works as the pixel electrode, the cathode works as the opposing electrode, and light is emitted toward the upper direction.

The gate electrode of the switching TFT 1004 is connected to the gate signal line G. As for the source region and the drain region of the switching TFT 1004, either one of them is connected to the source signal line S and the other one is connected to the gate electrode of the driving TFT 1005.

The source region of the driving TFT 1005 is connected to a power-source supply line V, and the drain region of the driving TFT 1005 is connected to the light-emitting element 1006. The capacitor 1007 is connected to the gate electrode of the driving TFT 1005 and to the power-source supply line V.

The pixel 1002 includes a reset TFT 1010, a buffer TFT 1011, a selection TFT 1012 and a photodiode 1013.

The gate electrode of the reset TFT 1010 is connected to a rest gate signal line RG. The source region of the reset TFT 1010 is connected to a sensor power-source line VB. The power-source line VB for sensor is maintained at a constant potential (reference potential) at all times. The drain region of the reset TFT 1010 is connected to the photodiode 1013 and to the gate electrode of the buffer TFT 1011.

Though not diagramed, the photodiode 1013 includes an N-type semiconductor layer, a P-type semiconductor layer, and a photoelectric conversion layer provided between the N-type semiconductor layer and the P-type semiconductor layer. Concretely speaking, the drain region of the reset TFT 1010 is connected to the P-type semiconductor layer or to the N-type semiconductor layer of the photodiode 1013.

The drain region of the buffet TFT 1011 is connected to the power-source line VB for sensor and is maintained at a constant reference potential at all times. The source region of the buffer TFT 1011 is connected to the source region or the drain region of the selection TFT 1012.

The gate electrode of the selection TFT 1012 is connected to a sensor gate signal line SG. One of the source region and the drain region of the selection TFT 1012 is connected to the source region of the buffer TFT 1011 as described above and the other one thereof is connected to the sensor output wiring SS. The sensor output wiring SS is connected to a constant current source 1003 to flow a constant current at all times.

Figure 17:
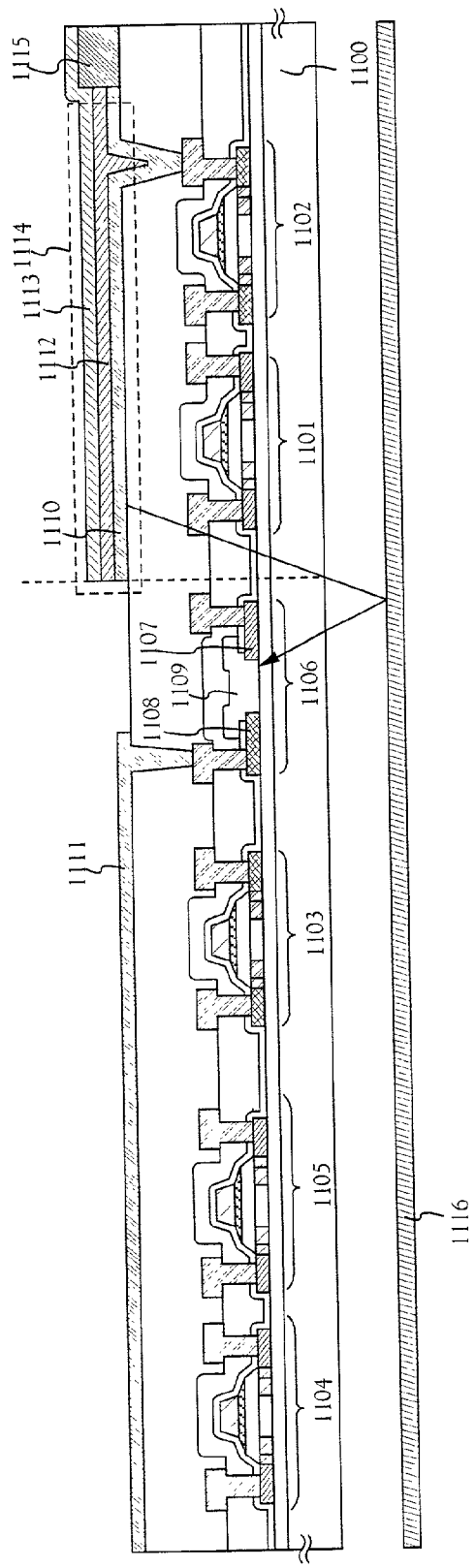
FIG. 17 is a sectional view of the pixel having the sensor (photodiode) of Embodiment 7.

FIG. 17 is a sectional view of the pixel according to the embodiment. Reference numeral 1101 denotes a switching TFT, 1102 denotes a driving TFT, 1103 denotes a reset TFT, 1104 denotes a buffer TFT, and 1105 denotes a selection TFT.

Further, reference numeral 1108 denotes a P-type semiconductor layer, 1109 denotes a photoelectric conversion layer and 1107 denotes an N-type semiconductor layer. A photodiode 1106 is formed by the P-type semiconductor layer 1108, photoelectric conversion layer 1109 and N-type semiconductor layer 1107. Reference numeral 1111 denotes a sensor wiring which electrically connects the P-type semiconductor layer 1108 to an external power source. Further, the P-type semiconductor layer 1108 of the photodiode 1106 is electrically connected to the drain region of the reset TFT 1103.

Reference numeral 1110 denotes a pixel electrode (anode), 1112 denotes an organic compound layer and 1113 denotes an opposing electrode (cathode). A light-emitting element 1114 is formed by the pixel electrode (anode) 1110, organic compound layer 1112 and opposing electrode (cathode) 1113. Reference numeral 1115 denotes a bank partitioning the organic compound layer 1112 of the neighboring pixels.

Reference numeral 1116 denotes a subject. Light emitted from the light-emitting element 1114 is reflected by the subject 1116 to fall on the photodiode 1106. In this embodiment, the subject 1116 is provided on the side where no TFT has been formed in the substrate 1100.

In this embodiment, the switching TFT 1101, buffer TFT 1104 and selection TFT 1105 are all N-channel TFTs. The driving TFT 1102 and the reset TFT 1103 are P-channel TFTs. This invention is not limited to this constitution only. Namely, the switching TFT 1101, driving TFT 1102, buffer TFT 1104, selection TFT 1105 and reset TFT 1103 may be either the N-channel TFTs or the P-channel TFTs.

Here, however, when the source region or the drain region of the driving TFT 1102 is electrically connected to the anode 1113 of the light-emitting element 1114 as in this embodiment, it is desired that the driving TFT 1102 is the P-channel TFT. Conversely, when the source region or the drain region of the driving TFT 1102 is electrically connected to the cathode of the light-emitting element 1114, it is desired that the driving TFT 1102 is the N-channel TFT.

In this embodiment, the photodiode can be formed simultaneously with other TFTs making it possible to suppress the number of the steps. With the photoelectric conversion element being incorporated in each pixel, furthermore, the display portion of the electronic device of the invention can be used as an image sensor. This embodiment can be used in free combination with the mode of use and with the embodiments 1 to 6.

The electronic device of the invention is allowed to be folded and is realized in a small size since the first housing and the second housing are coupled together by a hinge. Further, the electronic device of this invention has such a shape that the first center line of the first housing and the second center line of the second housing come into agreement and in parallel with each other only in a state where the first housing and the second housing are folded by the hinge. At the time of using the electronic device having the transmitting unit, therefore, the transmitting unit can be easily brought close to the mouth and the voice is transmitted to a remote user more clearly.

What is claimed is:

1. An electronic device comprising:
   a first housing including a first display unit and an operation key including a plurality of translucent buttons;
   a second housing including a second display unit; and
   a hinge,
   wherein the first and second housings are coupled together by the hinge,
   wherein a first center line of the first housing and a second center line of the second housing are in parallel with each other only in a state where the first housing and the second housing are folded via the hinge,
   wherein the first center line and the second center line are inclined relative to each other in a state where the first housing and the second housing are opened via the hinge,
   wherein the second housing includes a transmitting unit while the first housing includes a receiving unit,
   wherein the receiving unit is provided at a first end of the first housing opposite a second end of the first housing at which the hinge is located,
   wherein each of first directions of the first display unit and the second display unit is the same when arranging the first housing and the second housing in a vertical direction,
   wherein each of second directions of the first display unit and the second display unit is the same when arranging the first housing and the second housing in a lateral direction, and
   wherein each of the first directions is different from each of the second directions.

2. A device according to claim 1, wherein a first surface of the first housing and a second surface of the second housing oppose each other.

3. A device according to claim 1,
   wherein the first display unit is formed under the plurality of translucent buttons,
   wherein at least one of the first display unit and the second display unit includes one selected from the group consisting of a liquid crystal display device and a light emitting device.

4. A device according to claim 3,
   wherein a photoelectric conversion element is formed in the one selected from the group consisting of the liquid crystal display device and the light emitting device.

5. A device according to claim 1, wherein a symbol including at least one selected from the group consisting of a letter, a character, an alphabet, a numeral and a pictograph is displayed on the first display unit.

6. A device according to claim 1, wherein a picture is displayed on the second display unit.

7. A device according to claim 1, wherein the electronic device is an information terminal.

8. A device according to claim 1, wherein the electronic device is a cellular phone.

9. A device according to claim 1, wherein the electronic device is a PDA (personal digital assistant).

10. An electronic device comprising:
a first housing including a first display unit and an operation key including a plurality of translucent buttons;
a second housing including a second display unit; and
a hinge,
wherein the first and second housings are coupled together by the hinge,
wherein each of the first and second housings has a pair of lines opposing each other,
wherein one of the pair of lines of the first housing has a shorter length than the other one of the pair of lines of the first housing,
wherein one of the pair of lines of the second housing has a shorter length than the other one of the pair of lines of the second housing,
wherein the second housing includes a transmitting unit while the first housing includes a receiving unit,
wherein the receiving unit is provided at a first end of the first housing opposite a second end of the first housing at which the hinge is located,
wherein each of first directions of the first display unit and the second display unit is the same when arranging the first housing and the second housing in a vertical direction,
wherein each of second directions of the first display unit and the second display unit is the same when arranging the first housing and the second housing in a lateral direction, and
wherein each of the first directions is different from each of the second directions.

11. A device according to claim 10,
wherein the first display unit is formed under the plurality of translucent buttons,
wherein at least one of the first display unit and the second display unit includes one selected from the group consisting of a liquid crystal display device and a light emitting device.

12. A device according to claim 11, wherein a photoelectric conversion element is formed in the one selected from the group consisting of the liquid crystal display device and the light emitting device.

13. A device according to claim 10, wherein the electronic device is an information terminal.

14. A device according to claim 10, wherein the electronic device is a cellular phone.

15. A device according to claim 10, wherein the electronic device is a PDA (personal digital assistant).

16. An electronic device comprising:
a first housing including a first display unit and an operation key including a plurality of translucent buttons;
a second housing including a second display unit;
a hinge,
wherein the first and second housings are coupled together by the hinge,
wherein each of the first and second housings has a trapezoid shape,
wherein the second housing includes a transmitting unit while the first housing includes a receiving unit,
wherein the receiving unit is provided at a first end of the first housing opposite a second end of the first housing at which the hinge is located,
wherein each of first directions of the first display unit and the second display unit is the same when arranging the first housing and the second housing in a vertical direction,
wherein each of second directions of the first display unit and the second display unit is the same when arranging the first housing and the second housing in a lateral direction, and
wherein each of the first directions is different from each of the second directions.

17. A device according to claim 16,
wherein the first display unit is formed under the plurality of translucent buttons,
wherein at least one of the first display unit and the second display unit includes one selected from the group consisting of a liquid crystal display device and a light emitting device.

18. A device according to claim 17, wherein a photoelectric conversion element is formed in the one selected from the group consisting of the liquid crystal display device and the light emitting device.

19. A device according to claim 16, wherein the electronic device is an information terminal.

20. A device according to claim 16, wherein the electronic device is a cellular phone.

21. A device according to claim 16, wherein the electronic device is a PDA (personal digital assistant).

* * * * *

UNITED STATES PATENT AND TRADEMARK OFFICE
CERTIFICATE OF CORRECTION

| | | |
|---|---|---|
| PATENT NO. | : 8,331,996 B2 | Page 1 of 1 |
| APPLICATION NO. | : 10/072496 | |
| DATED | : December 11, 2012 | |
| INVENTOR(S) | : Yamazaki et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 991 days.

Signed and Sealed this
Sixteenth Day of December, 2014

Michelle K. Lee
*Deputy Director of the United States Patent and Trademark Office*